(12) United States Patent
Xiong et al.

(10) Patent No.: US 7,638,843 B2
(45) Date of Patent: Dec. 29, 2009

(54) INTEGRATING HIGH PERFORMANCE AND LOW POWER MULTI-GATE DEVICES

(75) Inventors: Weize W. Xiong, Austin, TX (US); Cloves Rinn Cleavelin, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 387 days.

(21) Appl. No.: 11/381,888

(22) Filed: May 5, 2006

(65) Prior Publication Data
US 2007/0259501 A1 Nov. 8, 2007

(51) Int. Cl.
H01L 27/01 (2006.01)
H01L 27/12 (2006.01)
H01L 31/0392 (2006.01)
H01L 29/76 (2006.01)
H01L 29/94 (2006.01)

(52) U.S. Cl. .............. 257/347; 257/348; 257/401; 257/368

(58) Field of Classification Search ............. 438/283; 257/308, 351, 365, 213, 327, 368, 348, 347, 257/401, 506
See application file for complete search history.

(56) References Cited

U.S. PATENT DOCUMENTS

2001/0002056 A1* 5/2001 Manning ............... 257/368
2008/0169511 A1* 7/2008 Muller et al. .......... 257/369

OTHER PUBLICATIONS

Hisamoto, et al., "FinFET-A Self-Aligned Double-Gate MOSFET Scalable to 20nm", IEEE Transactions on Electron Devices, vol. 47, No. 12, Dec. 2000, p. 2320-2325.
Park, et al., Multiple-Gate SOI MOSFETs: Device Design Guidelines, IEEE Transactions on Electron Devices, vol. 49, No. 12, Dec. 2002, p. 2222-2229.
Yu, et al., "FinFET Scaling to 10nm Gate Length", IEEE, 2002, pp. 251-254.
Chau, et al., "Advanced Depleted-Substrate Transistors: Single-Gate, Double-Gate and Tri-Gate", 2002 International Conference on Solid State Devices and Materials (SSDM 2002), Nagoya, Japan, pp. 1-23.
Yang, et al., "25 nm CMOS Omega FETs," IEEE, 2002, pp. 255-258.
Park, et al., "Pi-Gate SOI MOSFET", IEEE, 2001, pp. 405-406.
Choi, et al., "FinFET Process Refinements for Improved Mobility and Gate Work Function Engineering," IEEE, 2002, pp. 259-262.

* cited by examiner

*Primary Examiner*—Chuong A. Luu
(74) *Attorney, Agent, or Firm*—Warren L. Franz; Wade J. Brady, III; Frederick J. Telecky, Jr.

(57) ABSTRACT

A semiconductor device comprises a first multi-gate device and a second multi-gate device on a semiconductor substrate. The first multi-gate device comprises a first gate structure and the second multi-gate device comprises a second gate structure. An effective width of the first gate structure is greater than an effective width of the second gate structure.

14 Claims, 8 Drawing Sheets

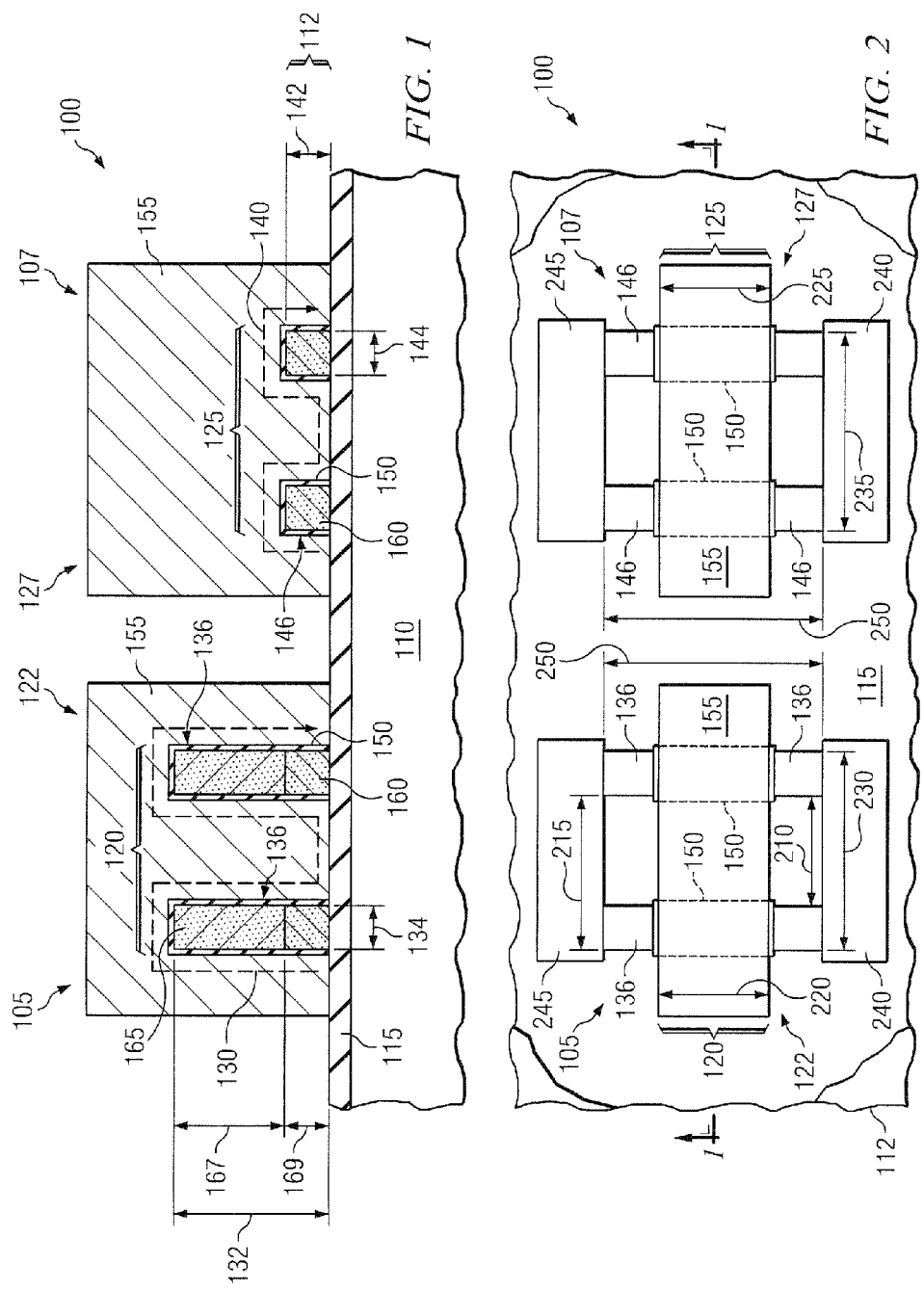

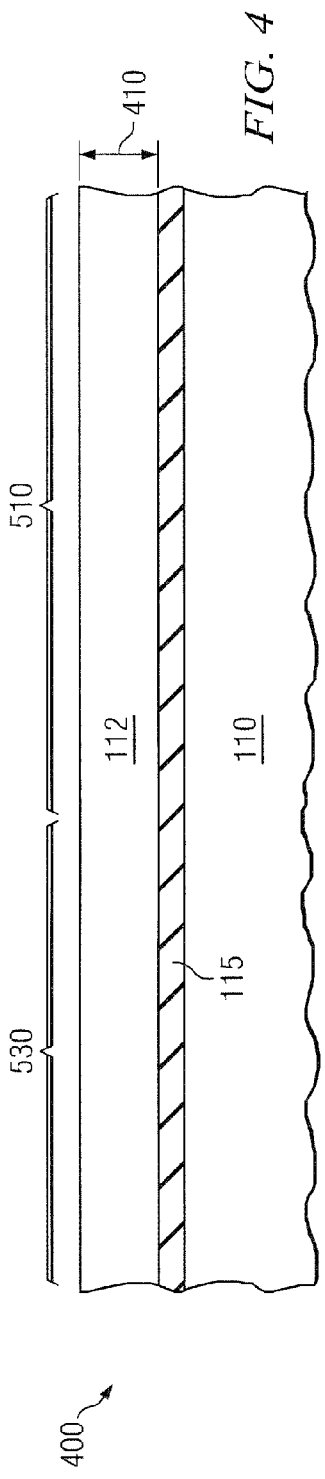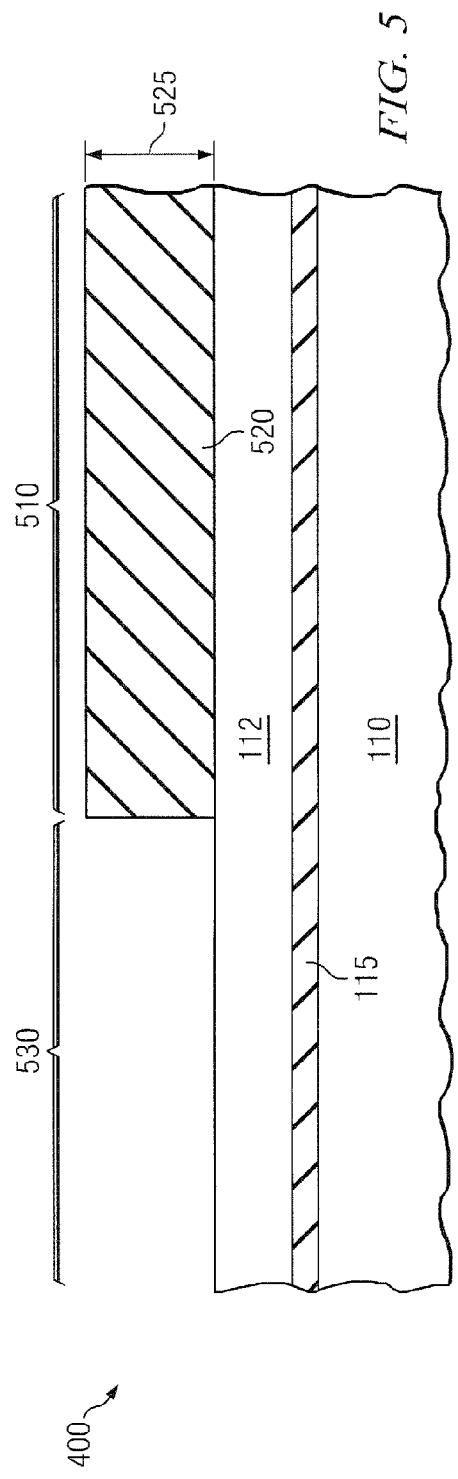

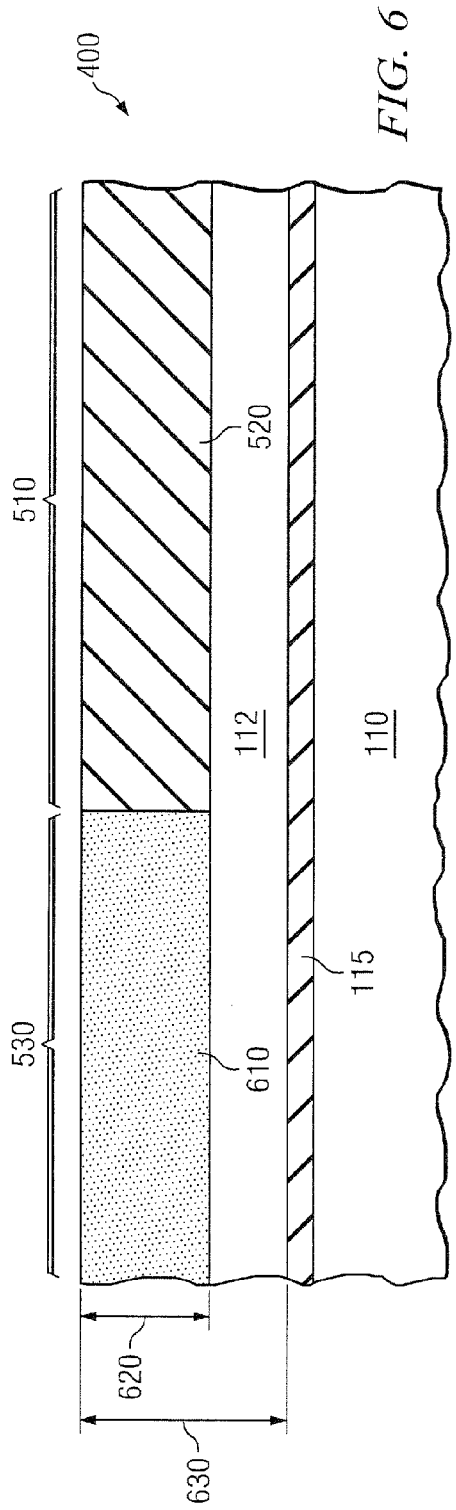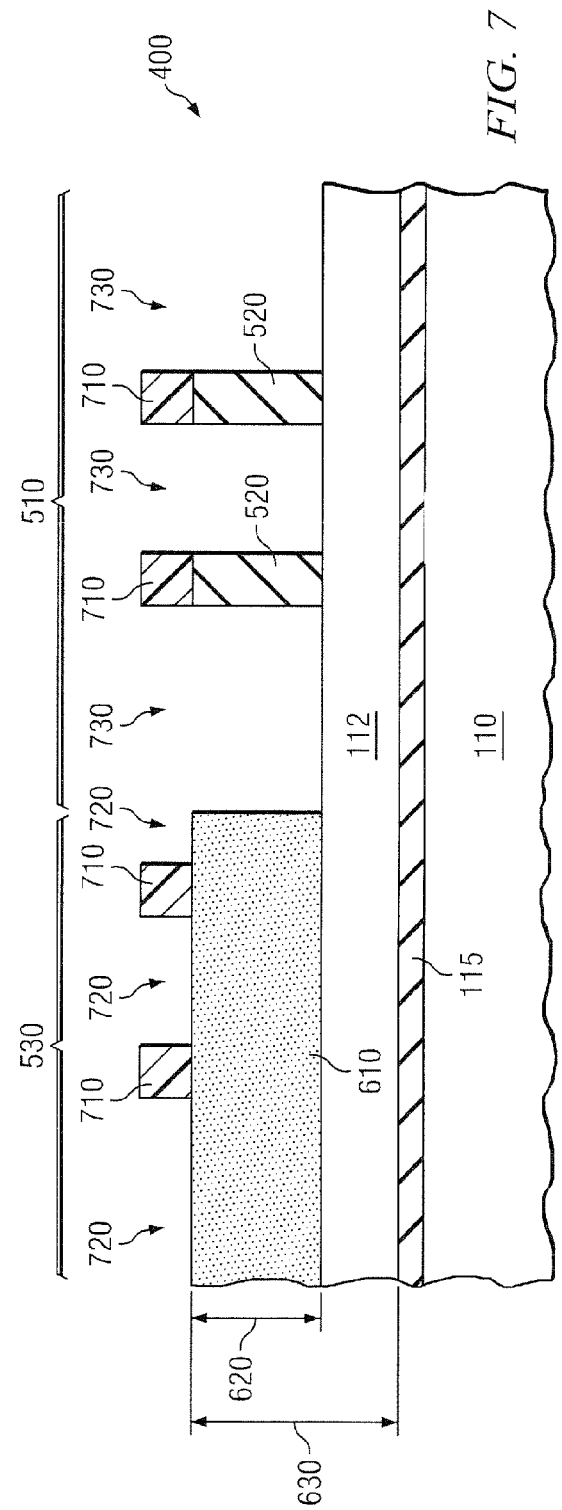

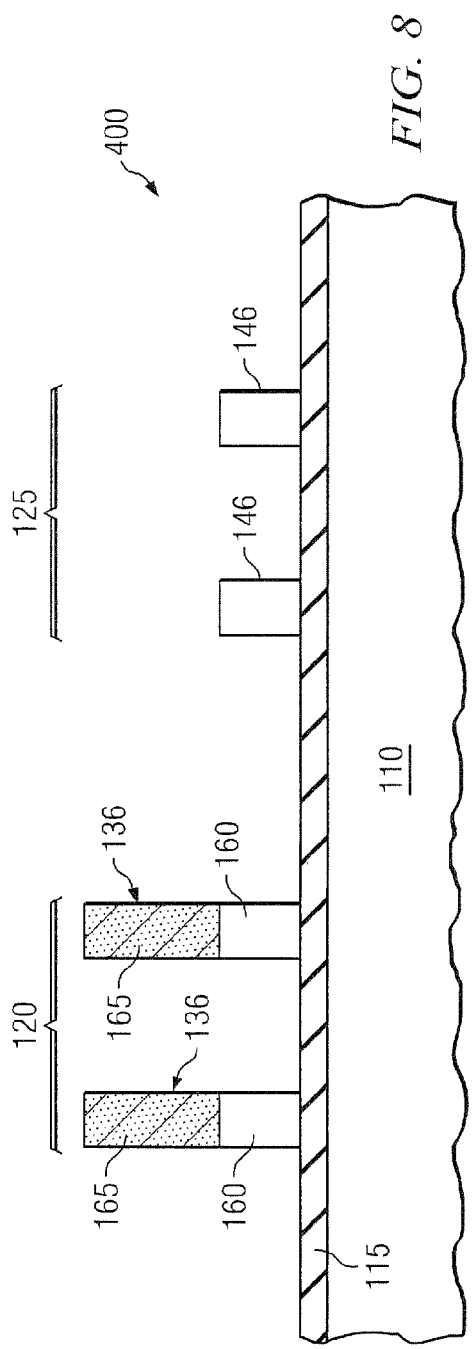
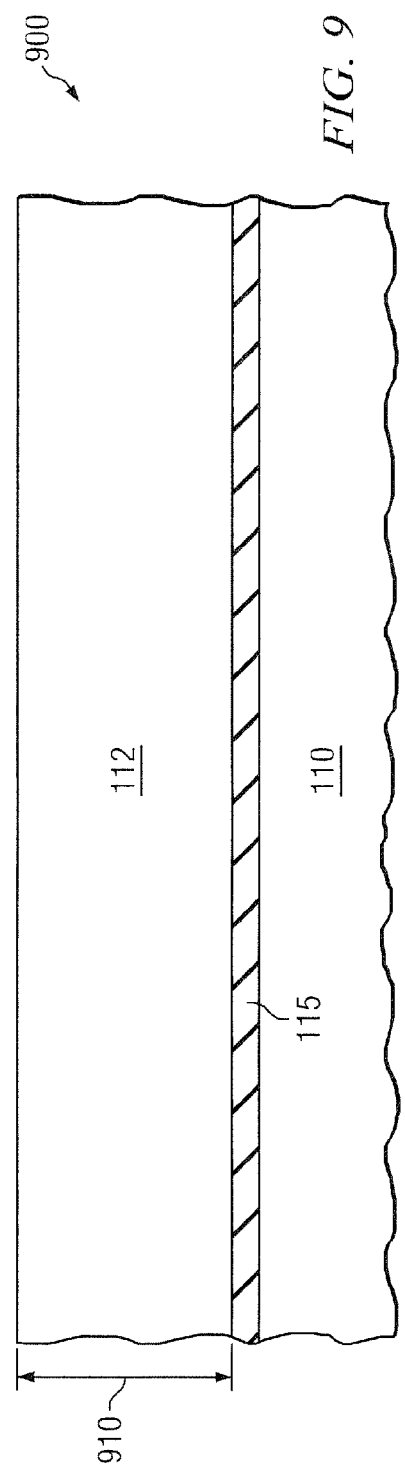

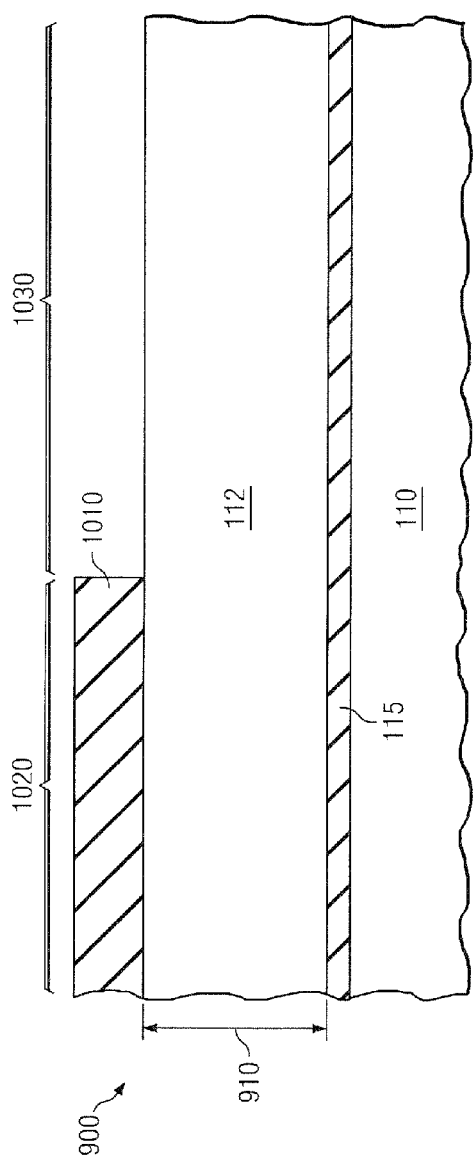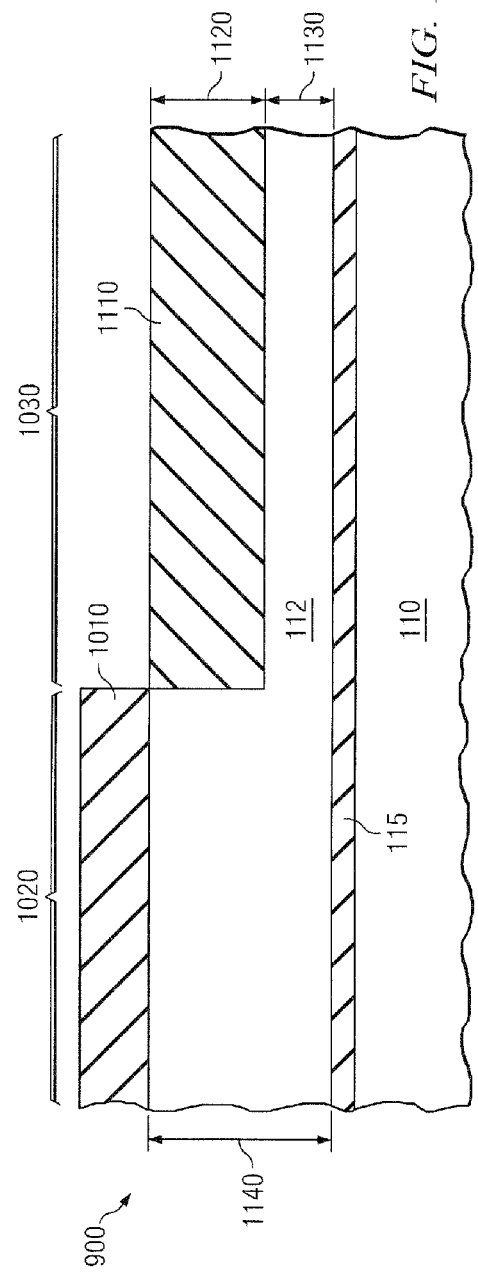

INTEGRATING HIGH PERFORMANCE AND LOW POWER MULTI-GATE DEVICES

The invention is directed, in general, to semiconductor devices and, more specifically, to multi-gate devices and their method of manufacture.

BACKGROUND

As the dimensions of semiconductor devices, e.g., field effect transistors (FET), continue to decrease, it is increasingly difficult to deal with short channel effects, increased on-currents, current leakage and threshold voltage control. For planar single-gate transistor devices, in addition to the gate controlling the channel, fringe fields from the source, drain or substrate also can affect the channel. These fringe fields can lower the threshold voltage and cause drain-induced barrier lowering, which in turn, increases the leakage current of the transistor. In addition, coupling between the source and channel degrades the sub-threshold current such that the ratio of the drive current when the device in the on-state ($I_{on}$), versus the sub-threshold current when the device is in the off-state ($I_{off}$), is lowered.

Multi-gate devices provide improved control of the channel, and thus superior $I_{on}:I_{off}$ ratio relative to planar single-gate transistor structures. Nevertheless, there are challenges to overcome if multi-gate devices are to be used in a broad range of applications in integrated circuits. Typically, for ease of fabrication and uniformity of optimized transistor characteristics, the dimensions of all the multi-gate devices in a circuit are the same. This choice, however, can compromise the performance of multi-gate devices intended for specialized applications, such as for delivering a high drive current (e.g., high $I_{on}$), or for operating with a low leakage current (e.g., low $I_{off}$).

Accordingly, what is needed is a multi-gate device and its method of manufacture that address the drawbacks of the prior art devices and methods.

SUMMARY

The invention provides a semiconductor device, comprising a first multi-gate device and second multi-gate device on a semiconductor substrate. The first multi-gate device comprises a first gate structure and the second multi-gate device comprises a second gate structure. An effective width of the first gate structure is greater than an effective width of the second gate structure.

Another embodiment is an integrated circuit. The integrated circuit comprises the above-described first and second multi-gate devices. Fins of a first channel region of the first multi-gate device are taller than fins of a second channel region of the second multi-gate device, thereby causing the effective width of the first gate structure to be greater than the effective width of the second gate structure.

Another embodiment comprises a method of manufacturing the above-described semiconductor device. Forming the first and second multi-gate devices comprises forming first and second channel regions and enclosing the channel regions with first and second gate structures, respectively, such that the effective width of the first gate structure is greater than the effective width of the second gate structure.

BRIEF DESCRIPTION OF THE DRAWINGS

FIGS. 1 and 2 illustrate cross-sectional and plan, cutaway views of an example semiconductor device of the invention;

FIGS. 4 to 13 illustrate cross-sectional views of selected steps in an example method of manufacturing a semiconductor device of the invention.

DESCRIPTION

Figure 3:
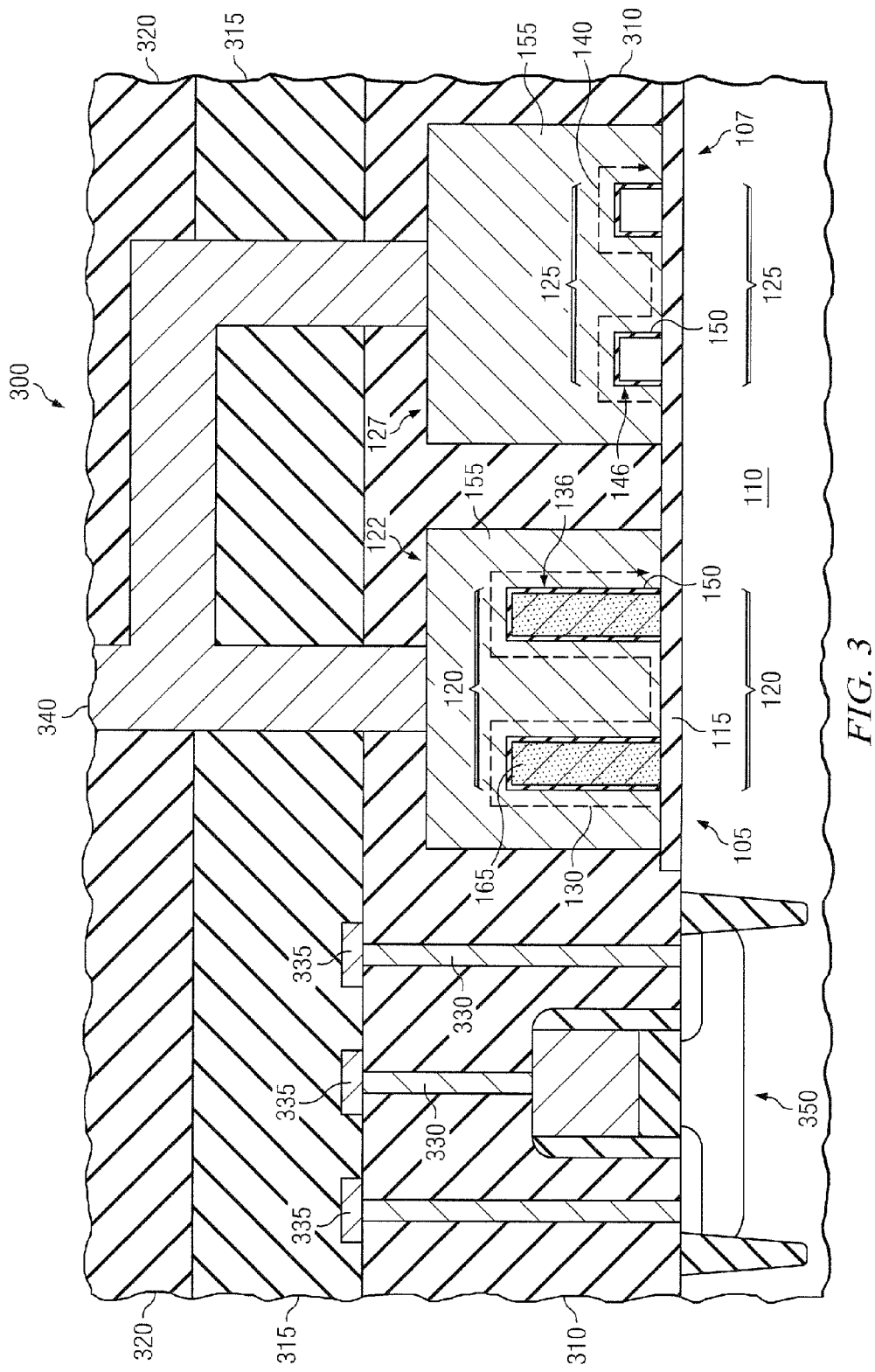
FIG. 3 shows a cross-sectional view of an example integrated circuit of the invention.

It has been found that by constructing multi-gate devices having different effective gate widths ($W_{eff}$) in the same integrated circuit, the operating characteristics of devices for specific applications can be improved. The drive current and leakage current of a multi-gate device can be tailored by adjusting the effective gate width ($W_{eff}$) of individual multi-gate devices. Foe example, for high power applications, by increasing the height of the fins of the channel region, the effective gate width ($W_{eff}$) is increased, thereby increasing the $I_{on}$. For low power, low leakage current applications, decreasing the height of the fins decreases the effective gate width ($W_{eff}$), thereby reducing $I_{off}$. Additionally, the reduction in $I_{off}$ is a result of a stronger top gate control of the channel region at shorter gate lengths.

Constructing such multi-gate devices in the same circuit can be problematic. Performing photolithography on a semiconductor substrate having two or more segments with different heights is a serious obstacle to device manufacturability. In particular, having segments on a substrate with different heights present depth-of-focus problems for photolithography. It can be difficult to, e.g., define a channel region comprising fins that are separated from each other by a pitch that is at, or near, the limits of photolithographic resolution. The invention also provides a method of manufacturing multi-gate devices that avoids the need to perform photolithography on different heights.

One aspect of the invention is a semiconductor device having multi-gate devices with differing $W_{eff}$. FIG. 1 shows a cross-sectional view of an example semiconductor device 100. FIG. 2 shows a plan view of the device 100, with gate structures depicted semi-transparently so that underlining structures can be seen. The device 100 comprises a first multi-gate device 105 and a second multi-gate device 107 on a semiconductor substrate 110. One preferred substrate 110 is a silicon-on-oxide (SOI) substrate having a silicon layer 112 and oxide layer 115. Other suitable substrates include bulk silicon substrate, or semiconductor on insulator substrates, including strained silicon on insulator, such as SiGe on insulator, Ge on insulator or similarly configured semiconducting materials.

The first multi-gate device 105 has a first channel region 120 enclosed by a first gate structure 122. The second multi-gate device 107 has a second channel region 125 enclosed by a second gate structure 127. The term multi-gate device as used herein refers to a semiconductor device comprising a channel region made of one or more raised portions (e.g., fins) that are enclosed on at least two sides by a gate structure.

A double-gate device is one form of multi-gate device in which the gate structure comprises two gates, one each on opposing sides of the channel region. A tri-gate device is another form of multi-gate. In a tri-gate device, the gate structure comprises three gates, two on opposing sides of the channel region and one (e.g., a top gate) adjacent to the two opposing gates. Those skilled in the art would be familiar with other configurations of multi-gate devices such as omega-gates or pi-gates.

The term, effective width of the gate or $W_{eff}$ as used herein refers to the total distance of gate structure lying between the source and drain of a multi-gate device. For example, for a tri-gate device whose channel region comprises a single fin, $W_{eff}$ equals about two times the height of the fin plus the fin's lateral thickness. If the channel region comprises more than one fin, then $W_{eff}$ equals the sum of two times the height of each fin plus each fin's lateral thickness.

As shown in FIG. 1, the $W_{eff}$ 130 for the first multi-gate device 105 equals about two times the heights 132 plus the lateral thicknesses 134 of the two first fins 136 of the first channel region 120. The $W_{eff}$ 140 for the second multi-gate device 107 equals two times the heights 142 plus the lateral thicknesses 144 of the two second fins 146 of the second channel region 125.

The maximum amount of $I_{on}$ that a multi-gate device can operate at is directly proportional to the device's $W_{eff}$. When the multi-gate device is used to transmit a high $I_{on}$, then it is desirable to increase $W_{eff}$. The minimum amount of $I_{off}$ that a multi-gate device can operate at is inversely proportional to the device's $W_{eff}$. When the multi-gate device is operated at a low $I_{off}$, then it is desirable to decrease $W_{eff}$.

Consider when the first multi-gate device 105 is designed to transmit a higher $I_{on}$ than the second multi-gate device 107. It is preferable for the $W_{eff}$ 130 of the first gate structure 122 to be greater than the $W_{eff}$ 140 of the second gate structure 127. In some cases, the $W_{eff}$ 130 for the first gate structure 122 is at least about 1.3 times (30%) greater than the $W_{eff}$ 140 of the second gate structure 127. This can be desirable for, e.g., static random access memory (SRAM) cells, where a pMOS multi-gate FET (e.g., the second multi-gate device 107) is designed to operate at a lower $I_{on}$ than an nMOS FET (e.g., the first multi-gate device 105). A low Beta ratio, (e.g., an $I_{on}$ (nMOS)/$I_{on}$ (pMOS) ratio of about 1 or less) can be cause problems with memory access during the write cycle of SRAM cells. Therefore in some preferred embodiment to keep the Beta ratio greater than 1.0, and more preferably 1.5 or greater, $W_{eff}$ 130 is at least about 2 times (100%) greater than $W_{eff}$ 140. This configuration can be especially desirable when one or more transistors are used in a high power application to transmit a signal to, e.g., a remote location on an integrated circuit, or to an array of SRAM cells.

$W_{eff}$ can be increased or decreased by adjusting the number of fins of the channel region or the lateral thickness of each fin. To minimize short channel effects and maximize $I_{on}$, it is desirable to form the maximum number of fins in the area of substrate available for the device, by, e.g., minimizing the lateral thickness 134, 144 of each fin and minimizing a gap 210 (FIG. 2) between the fins. In some embodiments, the number of fins, a fin-to-fin pitch 215, or both, are made constant for several, and in some cases all, of the multi-gate devices 105, 107 of the semiconductor device 100.

The dimensions of the fins may be constrained by factors other than the target $I_{on}$ or $I_{off}$. To retain the improvements over short channel effects compared to planar single-gate transistors, it is desirable for the ratio of the height 132, 142 to lateral thickness 134, 144 of the fins 136, 146 to be equal to or greater than 1:1. To avoid the formation of fragile fins, it is advantageous for the height-to-lateral-thickness ratio for each fin to be less than 10:1. For the same reason, it is beneficial for the each fin's lateral thickness 134, 144 and length 220, 225 covered by the gate 122, 127 (FIG. 2) to be at least about 10 nanometers, and more preferably, at least about 20 nanometers. To allow proper operation of the device 100, it is important to insure adequate space to allow the gate insulating layer 150 and metal gate electrode 155 to fill the gap 210 between the fins 135, 146. For example, in some cases, a gap 210 between fins 135, 145 of at least about 30 nanometers and a fin-to-fin pitch 215 of 100 nanometers or less is preferred.

In some cases, it is preferable to adjust $W_{eff}$ and hence $I_{on}$ and $I_{off}$ without having to alter the number of fins or pitch 215 between fins, because the these features may already be optimized to decrease short-channel effects. In such cases, preferably only the fin heights are altered to accomplish a change in $W_{eff}$ for one multi-gate device versus another multi-gate device. In some cases, the height 132 of the fins 136 of the first channel region 120 is defined by a target $I_{on}$ and $I_{off}$ for the first multi-gate device 105, and a height 142 of the fins 146 of the second channel region 125 is defined by a different target $I_{on}$ and $I_{off}$ for the second multi-gate device 107.

For the example device 100, a greater $W_{eff}$ 130, and hence greater $I_{on}$, of the first multi-gate device 105, compared to the $W_{eff}$ 140 of the second multi-gate device 107 can be due to a greater height 132 of the first fins 136 as compared to the height 142 of the second fins 146. For example, to achieve an about 30 percent greater $I_{on}$ in the first multi-gate device 105 compared to the second multi-gate device 107, the height 132 of the first fins 136 is preferably at least about 10 percent greater than the height 142 of the second fins 146.

Consider when a target $I_{on}$ for the first multi-gate transistor device 105 is greater than or equal to about 1.5 mA per micron of a lateral dimension 230 of the substrate 110 occupied by the first channel region 120. At a 32-nanometer technology node, such an $I_{on}$ is considered to be a high drive current. In some cases, each of the first fins 136 of the channel region 120 can have a first height 132 ranging from about 20 to 60 nanometers and a first lateral thickness 134 ranging from about 10 to 20 nanometers. Even more preferably, a ratio of the height 132 to thickness 134 ranges from about 3:1 to 6:1, with the upper ratio limited by manufacturability of the fins.

Consider when a target $I_{off}$ for the second multi-gate transistor device 107 is less than or equal to about 0.1 nA per micron of a lateral dimension 235 of the substrate 110 occupied by the second channel region 125. For example, at a 32-nanometer technology node, such an $I_{off}$ is considered to be a low leakage current. In such cases, preferred embodiments of the second fins 146 have a second height 132 ranging from about 10 nanometers to 20 nanometers and a second lateral thickness 144 ranging from about 10 to 20 nanometers. Even more preferably, a ratio of the height 142 to thickness 144 ranges from about 1:1 to 3:1, and more preferably, about 1:1 to 2:1. One skilled in the art would understand that these dimensions, as well as the $I_{on}$ and $I_{off}$ values that are considered to be high and low currents, would vary according to the technology node of interest.

In some preferred embodiments, the substrate 110 comprises an SOI substrate, and the fins 136, 146 of the channel regions 120, 125 are formed from a silicon layer 112 of the SOI substrate. As shown in FIG. 1, in some cases, to produce fins of differing heights, the first fins 136 of the first channel region 120 comprise a portion 160 of the silicon layer 112, with epitaxial material 165 (e.g., epitaxially grown silicon) selectively grown on that portion 160. In some preferred embodiments a height 167 of the epitaxial material 165 plus a height 169 of the silicon layer 112 equals the height 132 of the first fins 136. The second fins 146 of the second channel region 125 exclude the epitaxial material 165. In such cases, the height 169 of the layer 112 equals the height 142 of the second fins. The silicon layer 112, epitaxial material 165, or both can also be used to form other components of the multi-gate devices 105, 107, such as source and drain structures 240, 245 (FIG. 2).

In some cases, the fins 136, 146 of the first and second channel regions 120, 125 have a long lateral axis 250 (FIG. 2) that is aligned with a (110) orientation plane of a silicon layer 112 of the substrate 110. This can be beneficial when both multi-gate devices 105, 107 are configured as either pMOS or nMOS transistors in, e.g., a logic circuit or a high power circuit. In such instances, both of the multi-gate devices 105, 107 are designed to operate over the same range of $I_{on}$ and $I_{off}$, as modified by changing the $W_{eff}$ as described above.

In other cases, however, the long lateral axis 250 of the fins 136, 146 is aligned with a (100) orientation plane of the silicon layer 112. This is desirable when both multi-gate devices 105, 107 are configured as either pMOS or nMOS transistors in, e.g., an SRAM cell. The multi-gate devices 105, 107 configured as nMOS transistors are designed to operate at a higher $I_{on}$ than the multi-gate devices 105, 107 configured as pMOS transistors.

In other cases, however, the higher $I_{on}$ for the nMOS multi-gate transistors can be achieved solely by increasing the $W_{eff}$ of those transistors, as compared to the pMOS multigate transistors. This eliminates the need for the long axis 250 of the fins 136, 146 to be aligned with a (100) orientation plane of the layer 112. Having the long lateral axis 220 of the fins of the multi-gate devices in SRAM cells to be constructed in alignment with the same (e.g., (110)) orientation plane as other multi-gate devices located in other areas of the semiconductor device 100 (e.g., area for logic or high power circuits) can advantageously simplify device construction.

In some embodiments, the semiconductor device is configured as an integrated circuit. FIG. 3 presents a cross-sectional view of an example integrated circuit 300 (numbered similarly to FIGS. 1-2). Any of the above-described embodiments of the multi-gate devices can be incorporated into the integrated circuit 300. The integrated circuit 300 can comprise a portion of, or an entire, semiconductor chip or die.

As shown in FIG. 3, the integrated circuit 300 can comprise a first multi-gate device 105 on a semiconductor substrate 110 and a second multi-gate device 107 on the same substrate 110. The first multi-gate device 105 has a first channel region 120 enclosed with a first gate structure 122. The second multi-gate device 107 has a second channel region 125 enclosed with a second gate structure 127. Fins 136 of the first channel region 120 are taller than fins 146 of the second channel region 125, thereby causing a $W_{eff}$ 130 of the first gate structure 122 to be greater than a $W_{eff}$ 140 of the second gate structure 127.

The integrated circuit 300 further includes one or more dielectric layers 310, 315, 320 located over the multi-gate devices 105, 107 and interconnects 330, 335, 340 formed in and over the dielectric layers 310, 315, 320. The interconnects electrically couple the multi-gate device 105, 107 to each other, other multi-gate devices, or planar-single transistors 350, to complete the circuit. One or more of the multi-gate devices 105, 107 can comprise transistors in any or all of logic circuits, such as a complementary metal oxide semiconductor (CMOS) circuits, SRAM cells, higher power circuits or other conventional circuits used in integrated circuits.

Another aspect of the invention is a method of manufacturing a semiconductor device. Any of the above-described embodiments of devices discussed in the context of FIGS. 1-3 can be manufactured by the method. FIGS. 4-10 show selected steps in example implementations of the method of manufacturing a semiconductor device 400 (numbered similarly to FIGS. 1-2).

The method comprises forming first and second multi-gate devices on a semiconductor substrate. Forming the devices comprises multi-gate devices forming first and second channel regions. Preferably forming the first and second channel regions comprises forming one or more fins from the substrate. FIGS. 4-8 illustrate an embodiment of forming channel regions having different fin heights by a method that comprises forming an epitaxial layer on the substrate 110.

FIG. 4 shows the semiconductor device 100 after providing a substrate 110, such as an SOI substrate or silicon wafer. An important requirement of the method is to form the fins from two different thicknesses of the substrate so that different effective gate widths can be achieved. Preferably, the substrate 110 comprises a silicon layer 112 having a thickness 410 that is substantially equal to the height of the shorter fins of one of the channel regions. For example, the thickness 410 of the silicon layer 112 (e.g., a silicon layer 112 on an oxide layer 115 of an SOI substrate) is preferably substantially equal to a height 142 of one or more fins 146 of the second channel region 125 (FIG. 1).

FIG. 5 shows the device 100 after a segment 510 of the substrate 110 configured to have a channel region, is covered with a hardmask 520. For example, a silicon dioxide or silicon nitride layer is deposited by low-pressure chemical vapor deposition (CVD) and then subjected to photolithographic patterning procedures to define the hardmask 520. The covered segment 510 is configured to provide fins for a channel region having shorter fins, e.g., the fins 146 of the second channel region 125 in FIG. 1. An uncovered segment 530 of the substrate 110 is configured to provide fins for a channel region having taller fins, e.g., the fins 136 of the first channel region 120 in FIG. 1. In some cases, it is preferable for a thickness 525 of the hardmark 520 to be substantially the same as the height 132 of the epitaxial material 165 of the fins 136 (FIG. 1).

FIG. 6 shows the device 100 after depositing an epitaxial layer 610 on the silicon layer 112 of the substrate 110. Preferably, the epitaxial layer 610 is deposited on the segment 530 that is not covered by the mask 520. Commercial epitaxial growth tools, like CVD or atomic layer deposition (ALD) can be used to perform the epitaxial deposition of, e.g., silicon. These procedures are preferred because they are conducive to depositing a uniformly thick layer 610 over the entire substrate 110, thereby facilitating the production of fins of the equal heights. For example, the RMS deviation in the thickness 620 of the epitaxial layer 610 can be less than or equal to about 5 percent.

In some preferred embodiments, the epitaxial silicon layer 610 is deposited such that its thickness 620 plus the thickness 410 of the silicon layer 112 is substantially equal to a height of one or more fins of a channel region. For example, the total thickness 630 of these two layers 112, 610 equals the height 132 of the first fins 136. In other cases, if, e.g., excessive quantities of epitaxial material are deposited, the layer's thickness 620 can be reduced to substantially equal the thickness 525 of the hardmask 520 (FIG. 5). For example, chemical mechanical polishing (CMP) can be used to reduce the thickness 620 until the total thickness 630 equals the height 132 of the fins 136.

FIG. 7 show the device 100 after depositing a photoresist layer 710 on the substrate 110 and after patterning the photoresist layer 710 to form openings 720 to define regions of the substrate 110 to be etched. As illustrated in FIG. 7, in some preferred embodiments, the hardmask 520 is left on the substrate 110 so that the photoresist layer 710 is deposited and patterned on the hardmask 520 as well as the epitaxial silicon layer 175. Such embodiments allow photolithography to be performed over a uniform surface that includes both segments of the substrate 510, 530 configured to have channel regions. FIG. 7 also shows the device 100 after performing a selective oxide etch to remove portions of the hardmask 520 exposed by the openings 720 in the photoresist layer 710. In such embodiments openings 730 through the hardmask 520 extend to the silicon layer 112. An example selective oxide etch comprises a hydrofluoric acid wet etch.

FIG. 8 shows the device 100 after etching the silicon layer 112 and the epitaxial layer 610 of the two segments 510, 530 (FIG. 7) to form the fins 136, 146 of the channel regions 120, 125. As illustrated in FIG. 8, the first fins 136 can comprise epitaxial material 165 remaining from the epitaxial layer 610 and a portion 160 remaining from the silicon layer 112. In some preferred embodiments, the hardmask 520 is left on the silicon layer 112 during etching to remove portions of the layers 112, 610 exposed through the openings 720, 730 (FIG. 7). An example etch comprises a conventional dry etch using CF4, C2F6, HBr or other conventional silicon etchants. In some embodiments, the oxide layer 115 of an SOI substrate 110 is used as an etch stop. After completing the silicon etch, the patterned hardmask 520 (FIG. 7) is removed by a wet or dry etch process that does not affect the fins of channel region (e.g., a wet etch comprising hydrofluoric acid that removes a silicon oxide hardmask but not the silicon fins 136, 146).

Other embodiments of the method can include variations in the above-described processes to form the channel regions 120, 125. For instance, the hardmask 520 can be removed before depositing and patterning the photoresist layer 710. However, it can be difficult to accurately pattern a photoresist layer 710 formed on two different thicknesses of silicon. Inaccurate patterning, in turn, can lead to poorly defined fins when the silicon layer 170 and the epitaxial silicon layer 175 are etched. This has a disadvantage over the process shown in FIGS. 4-8 in that two separate series of masking and etch steps are needed to manufacture the channel regions.

Alternatively, a hardmask 520 without openings can be left on to protect one segment 510 (e.g., the segment with no epitaxial silicon layer 610), while the other segment 530 is etched to form the tall fins 136. The tall fins 136 can then be protected with, e.g., another hardmask, while the segment 510 having only the silicon layer 112 is etched to form the short fins 146.

FIGS. 9-11 illustrate an alternative embodiment of forming channel regions having different fin heights by a method that comprises the local oxidation of silicon (LOCOS) of the substrate 110. FIG. 9 shows a semiconductor device 900 after providing a substrate 110, similar to that shown in FIG. 4. In this case, however, the substrate 110 comprises a silicon layer 112 having a thickness 910 that is substantially equal to the height of taller fins. For example, the thickness 910 of the silicon layer 112 is substantially equal to a height 132 of one or more fins 136 of the first channel region 120 (FIG. 1).

Providing a substrate 110 having a thick silicon layer 112 (e.g., a thickness 910 of about 20 nm or greater) is desirable because it is easier to fabricate uniform thicknesses 910 of silicon across a whole wafer substrate 110 than a thin silicon layer (e.g., a thickness of less than about 20 nm). This can be advantageous over the process discussed above in the context of FIGS. 4-8, where a relatively thinner silicon layer 112 is used to, e.g., provide the shorter fins of the second channel region.

FIG. 10 shows the device 900 of FIG. 9 after forming a hardmask 1010 (e.g., a silicon nitride hardmask) over a segment 1020 of the substrate 110. Preferably, the hardmask 1010 covers the segment 1020 configured to have tall fins, e.g., the first channel region 120 (FIG. 1). An uncovered segment 1030 is configured to have a channel region with short fins, e.g., the second channel region 125 (FIG. 1). The procedure to form the hardmask 1010 is similar to that described above for the hardmask 520 shown in FIG. 5.

FIG. 11 shows the device 900 after performing a LOCOS of the segment 1030 of the silicon layer 170 that is not covered by the hardmask 1010. The LOCOS process forms an oxide layer 1110 out of a portion of the segment 1030. An advantage of using a LOCOS process is that very uniform thicknesses 1120 of silicon oxide 1110 can be formed. For example, in some embodiments the RMS deviation of the thickness 1120 of the silicon oxide layer 1110 is less than or equal to about ±5 percent. An example LOCOS process comprises a reverse silicon nitride hardmask 1010, the segment 1030 for oxidation is exposed while the silicon nitride hardmask 1010 covers the segment 1020 where oxidation is prevented. The oxide layer 1110 only grows in the segment 1030 not covered by the silicon nitride hardmask 1010. Therefore, the silicon is selectively consumed in the segment 1030 where oxidation occurs, and not where silicon nitride hardmask 1010 covers the underlying unoxidized silicon layer 112.

A remainder of the unoxidized silicon layer 112 in the segment 1030 has a thickness 1130 that is substantially equal to a height of one or more fins of the channel region. For example, the thickness 1130 of the remaining silicon layer 112 of the segment 1030 is substantially the same as the height 142 of the second fins 146 of the second channel region 125 (FIG. 1). A thickness 1140 of the silicon layer 112 in the hardmask-covered segment 1020 is substantially equal to a height 132 of one or more fins 136 of the first channel region 120 (FIG. 1).

The device 900 constructed in FIG. 11 is similar to the device 400 constructed in FIG. 6, and therefore the same processes can be used to form fins of the channel regions 120, 125 as described above in the context of FIGS. 7-8.

Figure 12:
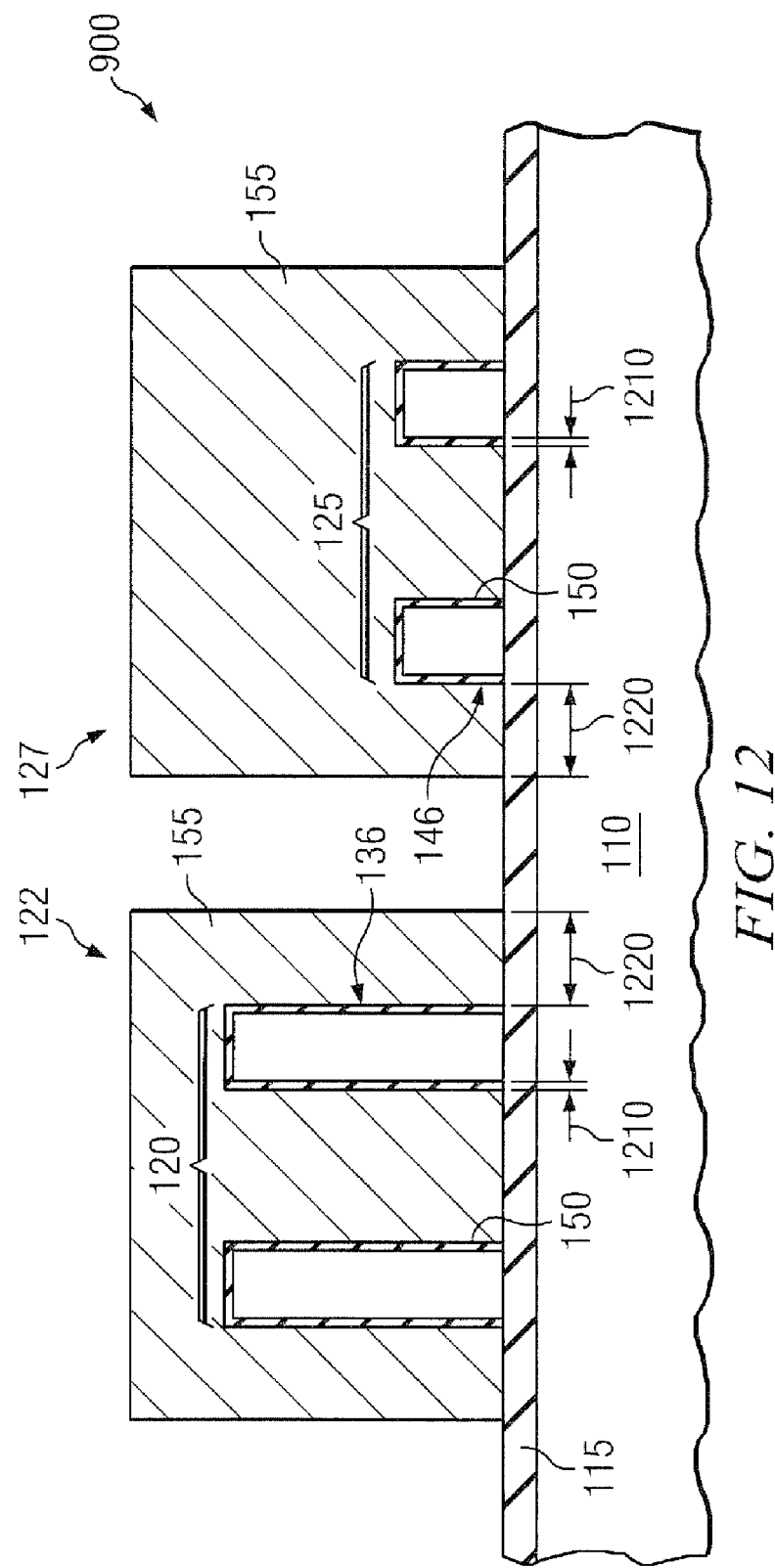

FIG. 12 shows the device 900 (or the device 400) after enclosing the first and second channel regions 120, 125 with first and second gate structures 122, 127, respectively, such that a $W_{eff}$ of the first gate structure is greater than a $W_{eff}$ of the second gate structure. Enclosing the first and second channel regions 120, 125 with the gate structures 122, 127 can comprise forming a dielectric layer 150 on the fins 136, 146. For example, the dielectric layer 150 can comprise silicon dioxide (SiO2) grown on the fins 135, 146 by thermal oxidation, or a high-k dielectric material deposited by low pressure or plasma-enhanced CVD. In some preferred embodiments, to reduce current leakage, nitrogen is included in the SiO2 dielectric layer 150 by a plasma nitrided oxidation process.

Enclosing the first and second channel regions 120, 125 with the gate structures 122, 127 also comprises depositing a metal electrode 155 over the fins 136, 146. For example, in some preferred embodiments, a metal electrode 155 comprising titanium nitride or silicon nitride can be deposited by a technique that can provide a uniform metal layer on the fins 136, 146, such as CVD or ALD. However, other deposition techniques such as physical vapor deposition (PVD) can also be used.

It is preferable for the thicknesses of the dielectric layer 150 and the metal electrode 155 to be kept to a minimum so that the gap 210 between fins can be minimized (FIG. 2). For example, in some preferred embodiments, a thickness 1210 of the dielectric layer 150 is about 2 nanometers or less and a thickness 1220 of the metal electrode 155 is about 5 nanometers or less.

Figure 13:
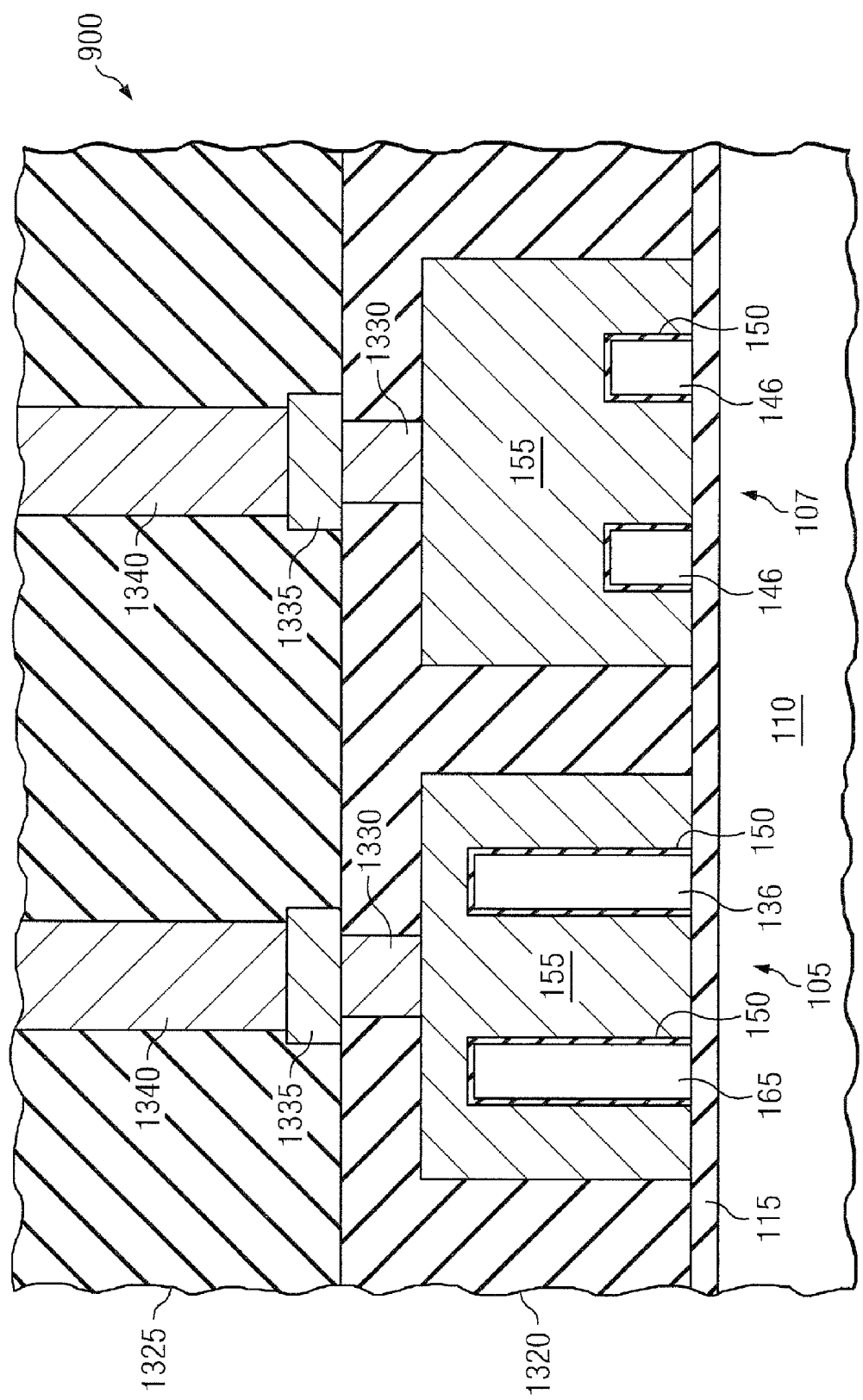

FIG. 13 shows the device 900 (or the device 400) after being configured as an integrated circuit. Forming the integrated circuit device 900 comprises forming insulating layers 1320, 1325 over the first and second multi-gate devices 105, 107 and forming interconnects 1330, 1335, 1340 in or on the insulating layers 1320, 1325, one or more of the interconnects 1330, 1335, 1340 contacting the first and second multi-gate devices 105, 107.

Those skilled in the art to which the invention relates will appreciate that other and further additions, deletions, substitutions and modifications may be made to the described example embodiments, without departing from the invention.

The invention claimed is:

1. A semiconductor device, comprising:
   a first multi-gate device on a semiconductor substrate, comprising a first gate structure; and
   a second multi-gate device on said semiconductor substrate, comprising a second gate structure;
   wherein an effective width of said first gate structure is greater than an effective width of said second gate structure; and
   wherein a first channel region enclosed by said first gate structure comprises one or more first fins and a second channel region enclosed by said second gate structure comprises one or more second fins, and said greater effective width is due to a greater height of said first fins as compared to said second fins.

2. The device of claim 1, wherein a height of fins of said first channel region is defined by a target $I_{on}$ and $I_{off}$ for said first multi-gate device, and a height of fins of said second channel region is defined by a different target $I_{on}$ and $I_{off}$ for said second multi-gate device.

3. The device of claim 1, wherein an $I_{on}$ for said first multi-gate device is greater than or equal to a 1.5 mA per micron of lateral distance of a first channel region enclosed by said first gate structure, and one or more fins of said first channel region have a height ranging from 20 nanometers to 60 nanometers and a lateral thickness ranging from about 10 nanometers to 20 nanometers.

4. The device of claim 3, wherein a ratio of said height to said lateral thickness ranges from about 3:1 to about 6:1.

5. The device of claim 1, wherein an $I_{off}$ for said second multi-gate device is less than or equal to a 0.1 nA per micron of lateral distance of a second channel region enclosed by said second gate structure; said second channel region comprising one or more fins, each of said fins having a height ranging from about 10 to 20 nanometers and a lateral thickness ranging from about 10 to 20 nanometers.

6. The device of claim 5, wherein a ratio of said height to said lateral thickness ranges from about 1:1 to about 2:1.

7. A semiconductor device, comprising:
   a first multi-gate device on a semiconductor substrate, comprising a first gate structure; and
   a second multi-gate device on said semiconductor substrate, comprising a second gate structure;
   wherein an effective width of said first gate structure is greater than an effective width of said second gate structure;
   wherein one or more fins of a channel region enclosed by said first gate structure comprise a portion of a silicon layer of said semiconductor substrate and epitaxial silicon on said silicon layer, and
   wherein one or more fins of a second channel region enclosed by said second gate structure exclude said epitaxial silicon.

8. A semiconductor device, comprising:
   a first multi-gate device on a semiconductor substrate, comprising a first gate structure; and
   a second multi-gate device on said semiconductor substrate, comprising a second gate structure;
   wherein an effective width of said first gate structure is greater than an effective width of said second gate structure; and
   wherein fins of a first channel region enclosed by said first gate structure and fins of a second channel region enclosed by said second gate structure have long lateral axes that are aligned with a (110) orientation plane of a silicon layer of said substrate.

9. A semiconductor device, comprising:
   a first multi-gate device on a semiconductor substrate, comprising a first gate structure; and
   a second multi-gate device on said semiconductor substrate, comprising a second gate structure;
   wherein an effective width of said first gate structure is greater than an effective width of said second gate structure; and
   wherein fins of a first channel region enclosed by said first gate structure and fins of a second channel region enclosed by said second gate structure have long lateral axes that are aligned with a (100) orientation plane of a silicon layer of said substrate.

10. The device of claim 7, wherein said first multi-gate device comprises one of a pMOS FET or an nMOS FET, and said second multi-gate device comprises the other of said pMOS FET or said nMOS FET.

11. An integrated circuit, comprising:
    a first multi-gate device on a semiconductor substrate, comprising a first channel region enclosed by a first gate structure; and
    a second multi-gate device on said semiconductor substrate, comprising a second channel region enclosed by a second gate structure;
    wherein fins of the first channel region are taller than fins of the second channel region thereby causing an effective width of said first gate structure to be greater than an effective width of said second gate structure.

12. The integrated circuit of claim 11, wherein one or more of said first and said second multi-gate devices comprise nMOS or pMOS transistors in a logic circuit, an SRAM cell or a higher power circuit.

13. The device of claim 3, wherein an $I_{off}$ for said second multi-gate device is less than or equal to a 0.1 nA per micron of lateral distance of a second channel region enclosed by said second gate structure; said second channel region comprising one or more fins, each of said fins having a height ranging from about 10 to 20 nanometers and a lateral thickness ranging from about 10 to 20 nanometers.

14. The device of claim 13, wherein a ratio of said height to said lateral thickness of said first channel region fins ranges from about 3:1 to about 6:1; and wherein a ratio of said height to said lateral thickness of said second channel region fins ranges from about 1:1 to about 2:1.

* * * * *

UNITED STATES PATENT AND TRADEMARK OFFICE
CERTIFICATE OF CORRECTION

PATENT NO. : 7,638,843 B2  Page 1 of 1
APPLICATION NO. : 11/381888
DATED : December 29, 2009
INVENTOR(S) : Xiong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 625 days.

Signed and Sealed this

Twenty-first Day of December, 2010

David J. Kappos
*Director of the United States Patent and Trademark Office*